United States Patent
Motozawa et al.

(10) Patent No.: US 10,291,238 B2
(45) Date of Patent: May 14, 2019

(54) SEMICONDUCTOR DEVICE AND PLL CIRCUIT

(71) Applicant: RENESAS ELECTRONICS CORPORATION, Tokyo (JP)

(72) Inventors: Atsushi Motozawa, Tokyo (JP); Yoshitaka Hirai, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/441,936

(22) Filed: Feb. 24, 2017

(65) Prior Publication Data

US 2017/0250692 A1 Aug. 31, 2017

(30) Foreign Application Priority Data

Feb. 26, 2016 (JP) .................. 2016-035532

(51) Int. Cl.
| | |
|---|---|
| *H03L 7/06* | (2006.01) |
| *H03L 7/08* | (2006.01) |
| *H03L 7/099* | (2006.01) |
| *H03L 7/087* | (2006.01) |
| *H03K 19/0175* | (2006.01) |

(Continued)

(52) U.S. Cl.
CPC .......... *H03L 7/0802* (2013.01); *H02M 3/07* (2013.01); *H03K 19/017509* (2013.01); *H03L 7/087* (2013.01); *H03L 7/099* (2013.01); *H03L 7/0991* (2013.01); *H03L 7/18* (2013.01); *H03M 1/742* (2013.01)

(58) Field of Classification Search
CPC .............................. H03L 7/0802; H02M 3/07

USPC ........................................... 327/159; 455/260
See application file for complete search history.

(56) References Cited

U.S. PATENT DOCUMENTS

| | | | |
|---|---|---|---|
| 7,741,919 B2 * | 6/2010 | Cowan ................. | H03L 7/0893 327/156 |
| 2002/0149398 A1 * | 10/2002 | Ingino, Jr. ............. | G05F 1/575 327/52 |

(Continued)

OTHER PUBLICATIONS

D. Mijuskovic, M. Bayer, T. Chomicz, N. Garg, F. James, P. McEntarfer, and J. Porter, "Cell-based Fully Integrated CMOS Frequency Synthesizers", IEEE Journal of Solid-State Circuits, vol. 29, No. 3, pp. 271-279, Mar. 1994.

(Continued)

*Primary Examiner* — Metasebia T Retebo
(74) *Attorney, Agent, or Firm* — McDermott Will & Emery LLP

(57) ABSTRACT

An object is to improve Power Supply Rejection Ratio in a PLL circuit. A proportional path 103 is provided in a first power supply system 101 and outputs analog proportional signal AP according to a detection signal DET. An integral path 104 is provided in a second power supply system and outputs an analog integral signal AI according to the DET. A CCO driver 16 is provided in the first power supply system 101 and outputs control current ICCO according to the AP and the AI. A CCO 17 is provided in the second power supply system 102 and outputs an output signal Fout according to the ICCO. A phase frequency detector 11 is provided in the second power supply system 102 and configured to detect a phase difference between a reference signal Fref and a signal FM obtained by feeding back the Fout and then outputs the DET.

12 Claims, 10 Drawing Sheets

(51) Int. Cl.
*H02M 3/07* (2006.01)
*H03L 7/18* (2006.01)
*H03M 1/74* (2006.01)

(56) References Cited

U.S. PATENT DOCUMENTS

2005/0248413 A1* 11/2005 Zhu ..................... H03L 7/0893
331/17
2013/0222067 A1  8/2013 Yin et al.

OTHER PUBLICATIONS

J. Craninckx and M. Steyaert, "A Fully Integrated CMOS DCS-1800 Frequency Synthesizer", IEEE Journal of Solid-State Circuits, vol. 33, No. 12, pp. 2054-2065, Dec. 1998.

* cited by examiner

SEMICONDUCTOR DEVICE AND PLL CIRCUIT

CROSS-REFERENCE TO RELATED APPLICATIONS

This application is based upon and claims the benefit of priority from Japanese patent application No. 2016-35532, filed on Feb. 26, 2016, the disclosure of which is incorporated herein in its entirety by reference.

BACKGROUND

The present invention relates to a semiconductor device and to, for example, a semiconductor device including a Phase Locked Loop (PLL) circuit.

As an example of the Phase Locked Loop (PLL) circuit, dual-path PLL circuits have been suggested (US Patent Publication No. 2013/0222067 and D. Mijuskovic, M. Baye-, T. Chomicz, N. Garg, F. James, P. McEntarfer, and J. Porter, "Cell-based Fully Integrated CMOS Frequency Synthesizers", IEEE Journal of Solid-State Circuits, Vol. 29, No. 3, pp. 271-279, March 1994, J. Craninckx and M. Steyaert, "A Fully Integrated CMOS DCS-1800 Frequency Synthesizer", IEEE Journal of Solid-State Circuits, Vol. 33, No. 12, pp. 2054-2065, December 1998.). These PLL circuits are so-called hybrid PLL circuits that each include an analog path and a digital path, and an integration process of an integral path is digitally performed. In the integral path of such a PLL circuit, a Voltage-Controlled Oscillator (VCO) is driven by using a regulator. By using the regulator, Power Supply Rejection Ratio (PSRR) can be improved.

SUMMARY

Although PSRR can be improved in the above PLL circuit by using the regulator, there is a following problem. Specifically, noise of the regulator may not only influence the characteristics of the PLL circuit but may also cause a problem that an area and power consumption of the regulator will become large in order to reduce the noise of the regulator.

Other problems of the related art and new features of the present invention will become apparent from the following descriptions of the specification and attached drawings.

According to an aspect, a phase locked loop circuit of a semiconductor device includes: a proportional path provided in a first power supply system and configured to output an analog proportional signal according to a detection signal, the detection signal indicating a phase difference between a reference signal and a signal obtained by feeding back an output signal of the phase locked loop circuit; an integral path provided in a second power supply system and configured to output an analog integral signal according to the detection signal, a voltage of the second power supply system being lower than that of the first power supply system; a current-controlled oscillator driver provided in the first power supply system and configured to output control current according to the analog proportional signal from the proportional path and the analog integral signal from the integral path; a current-controlled oscillator provided in the second power supply system and configured to output an output signal generated by performing an oscillation operation according to the control current; and a phase frequency detector provided in the second power supply system and configured to detect a phase difference between the reference signal and the signal obtained by feeding back the output signal and then output a result of the detection as the detection signal.

According to the above aspect, it is possible to improve Power Supply Rejection Ratio in the PLL circuit while preventing an increase in the circuit size.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Hereinafter, embodiments of the present invention will be described with reference to the drawings. The same elements are denoted by the same reference signs, and repeated descriptions are omitted.

First Embodiment

Figure 1:
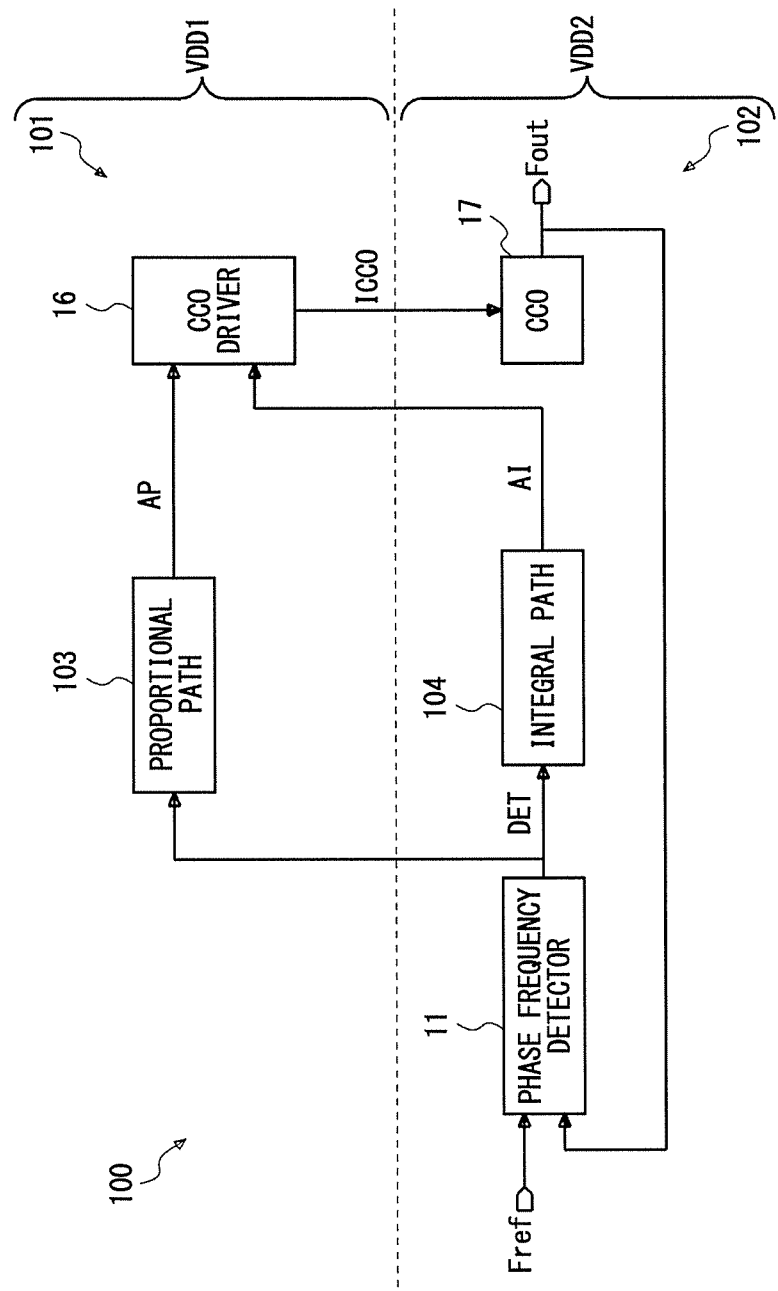
FIG. 1 is a drawing schematically showing a basic configuration of a PLL circuit according to a first embodiment.

A semiconductor device according to a first embodiment will be described below. The semiconductor device according to the first embodiment includes a Phase Locked Loop (PLL) circuit 100. Hereinafter, the PLL circuit 100 will be described. FIG. 1 is a drawing schematically showing a basic configuration of the PLL circuit 100 according to the first embodiment. The PLL circuit 100 is a hybrid PLL circuit that includes a proportional path 103 and an integral path 104.

The PLL circuit 100 includes a first power supply system 101 that receives power from a first power supply VDD1 and a second power supply system 102 that receives power from a second power supply VDD2. Hereinafter, in order to simplify the terms, a voltage of the first power supply VDD1 will be referred to as VDD1, and a voltage of the second power supply VDD2 will be referred to as VDD2. In the following descriptions, an output voltage of the second power supply VDD2 is lower than that of the first power supply VDD1 (VDD1>VDD2). In this embodiment, the first power supply VDD1 is, for example, a power supply of an I/O (an input and output unit) of a semiconductor device into which the PLL circuit 100 is incorporated, and the output voltage of the first power supply VDD1 is, for example, 1.8 [V] (VDD1=1.8 [V]). Further, in this embodiment, the second power supply VDD2 is, for example, a power supply of a core of the semiconductor device into which the PLL circuit 100 is incorporated, and the output voltage of the second power supply VDD2 is, for example, 0.8 [V] (VDD2=0.8 [V]).

The first power supply system 101 includes Metal-Oxide-Semiconductor (MOS) transistors that constitute various functional blocks. Likewise, the second power supply system 102 includes MOS transistors that constitute various functional blocks. The MOS transistors of the first power supply system 101 have breakdown voltages greater than those of the MOS transistors of the second power supply system 102. Therefore, as described above, a voltage of the first power supply system 101 can be greater than that of the second power supply system 102, and a sufficient drain-to-source voltage can be applied, thereby increasing an output resistance.

The PLL circuit 100 includes a Phase Frequency Detector (PFD) 11, a Current-Controlled Oscillator (CCO) driver 16, a CCO 17, the proportional path 103, and the integral path 104. The CCO driver 16 and the proportional path 103 are included in the first power supply system 101. The PFD 11, the CCO 17, and the integral path 104 are included in the second power supply system 102.

The PFD 11 detects a phase difference between a reference signal Fref supplied from outside the PLL circuit 100 and a signal fed back from the CCO 17. The PFD 11 outputs the detected phase difference (a result of the detection) as a detection signal DET. At this time, for example, the output signal Fout is divided by a frequency divider (not shown), and the divided signal is supplied to the PFD 11 as a signal obtained by feeding back the output signal Fout.

The proportional path 103 is an analog path and outputs an analog proportional signal AP that is a current signal according to the detection signal DET from the PFD 11. Note that as the detection signal DET from the PFD 11 is generated by the first power supply system 101, when the detection signal DET is supplied to the second power supply system 102, a voltage level is adjusted as appropriate by a level shifter or the like (not shown in FIG. 1).

The integral path 104 is a digital path and outputs an analog integral signal AI that is a voltage signal according to the detection signal DET from the PFD 11.

The CCO driver 16 controls control current ICCO which will be output according to the analog proportional signal AP and the analog integral signal AI.

The CCO 17 performs an oscillation operation and outputs the output signal Fout according to the control current ICCO. Further, the output signal Fout is fed back to the PFD 11.

In this embodiment, the MOS transistors of the first power supply system 101 have breakdown voltages greater than those of the MOS transistors of the second power supply system 102. Therefore, as described above, the voltage of the first power supply system 101 can be greater than that of the second power supply system 102, and a sufficient drain-to-source voltage can be applied, thereby increasing the output resistance. It will be understood that when the proportional path 103 and the CCO driver 16 are composed of the MOS transistors of the first power supply system 101 with a high output resistance, Power Supply Rejection Ratio (PSRR) can be more improved than when the proportional path 103 and the CCO driver 16 are composed of the MOS transistors of the second power supply system 102.

Figure 2:
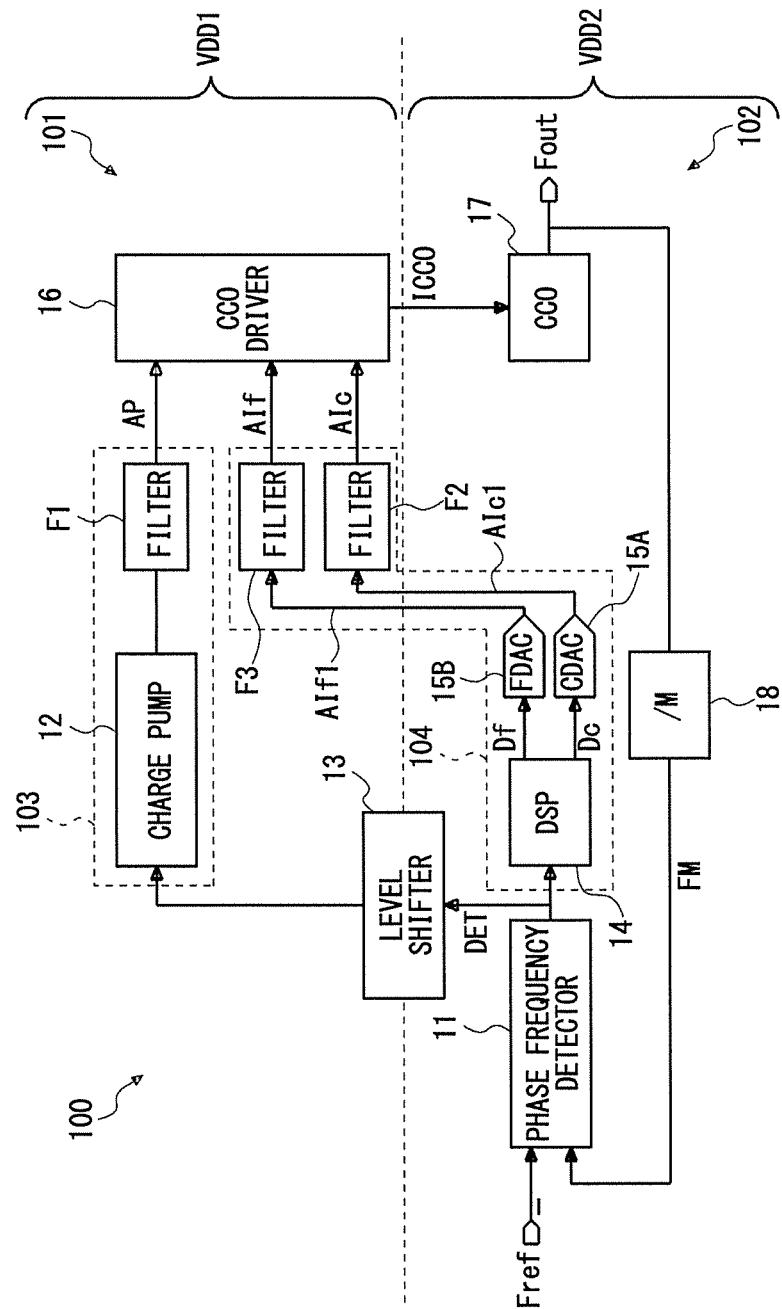
FIG. 2 is a drawing schematically showing a configuration of the PLL circuit according to the first embodiment.

Next, the configuration of the PLL circuit 100 will be described in more detail. FIG. 2 is a drawing schematically showing the configuration of the PLL circuit 100 according to the first embodiment. The configuration shown in FIG. 2 further includes a level shifter 13 and a frequency divider 18 in the configuration shown in FIG. 1.

The level shifter 13 is provided to exchange signals between the first power supply system 101 and the second power supply system 102. In this embodiment, the level shifter 13 shifts a voltage level of the detection signal DET in order to supply the detection signal DET from the PFD 11 provided in the second power supply system 102 to the proportional path 103 provided in the first power supply system 101.

The frequency divider 18 divides the output signal Fout fed back from the CCO 17 by M (M is an integer of two or greater) and then outputs a divided signal FM to the PFD 11.

The proportional path 103 includes a charge pump 12 and a filter F1.

The charge pump 12 outputs the analog proportional signal AP according to the detection signal DET. In other words, the charge pump 12 functions as a proportional signal generation unit that generates the analog proportional signal AP in the proportional path 103.

The filter F1 is inserted between an output of the charge pump 12 and an input of the analog proportional signal AP of the CCO driver 16. The filter F1 can reduce a spurious component in the analog proportional signal AP.

The integral path 104 includes a Digital Signal Processor (DSP) 14, a Coarse Digital to Analog Converter (CDAC) 15A, a Fine Digital to Analog Converter (FDAC) 15B, and filters F2 and F3.

The DSP 14 integrates the detection signal DET by digital signal processing and then outputs a result of the integration as digital integral signals Dc and Df.

The CDAC 15A is a Coarse Digital to Analog Converter (DAC) that performs Digital to Analog Conversion (D/A conversion) on a digital integral signal Dc for coarsely adjusting the CCO driver 16. The CDAC 15A outputs an analog integral signal AIc1 that is a voltage signal obtained by performing D/A conversion on the digital integral signal Dc.

The FDAC 15B is a DAC that performs D/A conversion on the digital integral signal Df for finely adjusting the CCO driver 16. The FDAC 15A outputs an analog integral signal AIf1 that is a voltage signal obtained by performing D/A conversion on the digital integral signal Df.

The filters F2 and F3 are reconstruction filters. The filter F2 is inserted between the CDAC 15A and an input of the analog integral signal AIc of the CCO driver 16. The analog integral signal AIc1 is filtered by the filter F2 and then output to the CCO driver 16 as the analog integral signal AIc. The filter F3 is inserted between the FDAC 15B and an input of the analog integral signal AIf of the CCO driver 16. The analog integral signal AIf1 is filtered by the filter F3 and then output to the CCO driver 16 as the analog integral signal AIf. Note that in order to simplify the description, in FIG. 1, the analog integral signals AIc and AIf are collectively referred to as an analog integral signal AI.

Hereinafter, the CDAC 15A may be referred to as a first Digital to Analog Converter (DAC), and the FDAC 15B may be referred to as a second Digital to Analog Converter (DAC). In this case, the digital integral signal Dc may be referred to as a first digital integral signal, and the digital integral signal Df may be referred to as a second digital integral signal. The filter F2 may be referred to as a first filter, and the filter F3 may be referred to as a second filter. Further, the FDAC 15B may be referred to as a first Digital to Analog Converter (DAC), and the CDAC 15A may be referred to as a second Digital to Analog Converter (DAC). In this case, the digital integral signal Df may be referred to as a first digital integral signal, and the digital integral signal Dc may be referred to as a second digital integral signal. The filter F3 may be referred to as a first filter, and the filter F2 may be referred to as a second filter.

Figure 3:
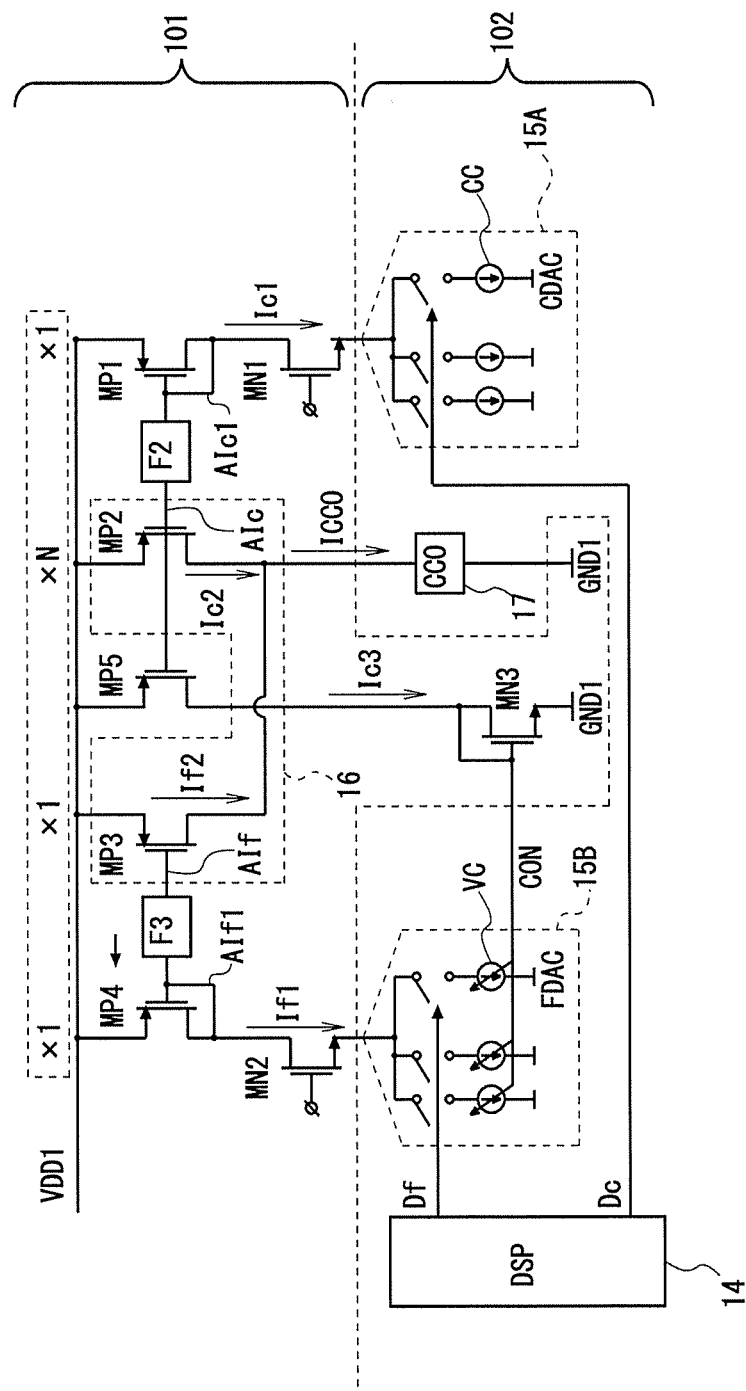
FIG. 3 is a drawing showing a connection relationship between a DSP, an FDAC, a CDAC, a CCO driver, a CCO, and a filter.

FIG. 3 is a drawing showing a connection relationship among the DSP 14, the CDAC 15A, the FDAC 15B, the CCO driver 16, the CCO 17, and the filters F2 and F3.

The DSP 14 outputs the digital integral signal Dc to the CDAC 15A and outputs the digital integral signal Df to the FDAC 15B.

The sources of the P-channel Metal-Oxide-Semiconductor (PMOS) transistors MP1 to MP5 are connected to the first power supply VDD1. In this configuration, the PMOS transistors MP2 and MP3 constitute the CCO driver 16. The drain of the PMOS transistor MP1 is connected to the drain of an N-channel Metal-Oxide-Semiconductor (NMOS) transistor MN1. The drain of the PMOS transistor MP2 is connected to the CCO driver 16. The gate of the PMOS transistor MP1 is connected to the drain of the PMOS transistor MP1 and also to the gate of the PMOS transistor MP2 with the filter F2 interposed therebetween. That is, the PMOS transistors MP1 and MP2 constitute a current mirror (may be referred to a first current mirror). Thus, the analog integral signal AIc1 having a voltage determined by current Ic1 flowing through the PMOS transistor MP1 appears at the gate of the PMOS transistor MP1. Then, the analog integral signal AIc1 is applied to the gate of the PMOS transistor MP2, which is an input terminal of the analog integral signal AIc of the CCO driver 16, as the analog integral signal AIc through the filter F2.

The source of the NMOS transistor MN1 is connected to the CDAC 15A. The gate of the NMOS transistor MN1 is biased to an appropriate potential so that low breakdown voltages of the MOS transistors of the second power supply system 102, which constitute the CDAC 15A, can be ensured.

The CDAC 15A is composed of a plurality of constant current cells CC that are arranged in parallel and is configured to be capable of controlling the number of the constant current cells CC that supply current according to a value of the digital integral signal Dc. In this example, switches are inserted between respective one ends of the plurality of constant current cells CC and the source of the NMOS transistor MN1. The other ends of the constant current cells CC are grounded. When the switches are opened or closed according to the digital integral signal Dc, the number of the constant current cells CCs that supply current is controlled.

The drain of the PMOS transistor MP3 is connected to the CCO driver 16. The drain of the PMOS transistor MP4 is connected to the drain of the NMOS transistor MN2. The gate of the PMOS transistor MP4 is connected to the drain of the PMOS transistor MP4 and also to the gate of the PMOS transistor MP3 with the filter F3 interposed therebetween. That is, the PMOS transistor MP3 and the PMOS transistor MP4 constitute a current mirror (may be referred to as a second current mirror). Thus, the analog integral signal AIf1 having a voltage determined by current If1 flowing through the PMOS transistor MP4 appears at the gate of the PMOS transistor MP4. Then, the analog integral signal AIf1 is applied to the gate of the PMOS transistor MP3, which is an input terminal of the analog integral signal AIf of the CCO driver 16, as the analog integral signal AIf through the filter F3.

The source of the NMOS transistor MN2 is connected to the FDAC 15B. The gate of the NMOS transistor MN2 is biased to an appropriate potential so that low breakdown voltages of the MOS transistors of the second power supply system 102 that constitute the FDAC 15B can be ensured.

The FDAC 15B is composed of a plurality of variable current cells VC that are arranged in parallel and is configured to be capable of controlling the number of variable current cells VC that supply current according to a value of the digital integral signal Df. In this example, switches are inserted between respective one ends of the plurality of variable current cells VC and the source of the NMOS transistor MN2. The other ends of the variable current cells VC are grounded. When the switches are opened or closed according to the digital integral signal Df, the number of variable current cells VCs that supply current is controlled. Further, a control terminal of the plurality of variable current cells VC is connected to the gate of the NMOS transistor MN3, and output current is changed according to a control signal CON (a bias voltage) to be applied.

The PMOS transistor MP5 and the NMOS transistor MN3 constitute a control voltage generation circuit that generates the control signal CON for controlling current of the plurality of variable current cells VC of the FDAC 15B. The drain of the PMOS transistor MP5 is connected to the drain of the NMOS transistor MN3. The gate of the PMOS transistor MP5 is connected to the gate of the PMOS transistor MP2. The source of the NMOS transistor MN3 is grounded to a ground GND2 of the second power supply system. The gate of the NMOS transistor MN3 is connected to the drain of the NMOS transistor MN3 and the control terminal of the variable current cells VC of the FDAC 15B. Then, the control signal CON is supplied to the variable current cells VC of the FDAC 15B.

In the example of FIG. 3, the current flowing through the PMOS transistor MP1 and the NMOS transistor MN1 is the current Ic1 (may be referred to as first current), and current flowing through the PMOS transistor MP4 and the NMOS transistor MN2 is the current If1 (may also be referred to as second current). Further, current flowing through the PMOS transistor MP2 will be referred to as current Ic2 (may also be referred to as third current), current flowing through the PMOS transistor MP3 will be referred to as current If2 (may also be referred to as fourth current), and current flowing through the NMOS transistor MN3 will be referred to as current Ic3 (may also be referred to as fifth current). Accordingly, control current ICCO input to the CCO driver 16 is ICCO=Ic2+If2.

Moreover, the current Ic2 of a coarse adjusting path responsible for coarsely adjusting the control current ICCO (i.e., a path including the PMOS transistor MP2) is N times (where N is a value greater than one) unit current I flowing through the CDAC 15A and the FDAC 15B (Ic2=NI), and a mirror ratio of the current Ic1 to the current Ic2 is 1:N. In this embodiment, a mirror ratio is, for example, 1:10(N=10 and Ic2=10I).

The current If2 of a fine adjusting path responsible for finely adjusting the control current ICCO (i.e., a path including the PMOS transistor MP3) is equivalent to the unit current I flowing through the CDAC 15A and the FDAC 15B (If2=If1=I). However, the mirror ratio of the current If1 to the current Ic2 is not limited to 1:1.

Accordingly, a ratio of the current Ic2 of the coarse adjusting path to the current If2 of the fine adjusting path can be 10:1. However, this ratio is merely an example, and the ratio can be any ratio as long as the current Ic2 of the coarse adjusting path is greater than the current If2 of the fine adjusting path.

As described above, according to this configuration, the current of the variable current cells VC of the FDAC 15B is controlled by the control signal CON that is based on the current Ic3, which is obtained by duplicating the current Ic1 by a predetermined mirror ratio. At this time, the current is controlled to have the following ratio.

$$Ic1:Ic3:If1=1:A:A/B \times Df$$

In the above ratio, A represents a ratio (a mirror ratio) of the current Ic3 to the current Ic1, and B represents a ratio of the current Ic3 to the unit current of the variable current cells VC.

The PLL circuit 100 according to this embodiment is controlled in such a way that the above mirror ratio of the current Ic2 of the coarse adjusting path to the current If2 of the fine adjusting path is maintained. That is, in the above example, the mirror ratio of the current Ic2 of the coarse adjusting path to the current If2 of the fine adjusting path is maintained at 10:1. When there are, for example, temperature variations or power supply variations, the current of the constant current cells of the CDAC also varies. Thus, the current Ic1 varies. The PLL circuit 100 is controlled to eliminate the variations in the current Ic1. A specific example will be described below.

Figure 4:
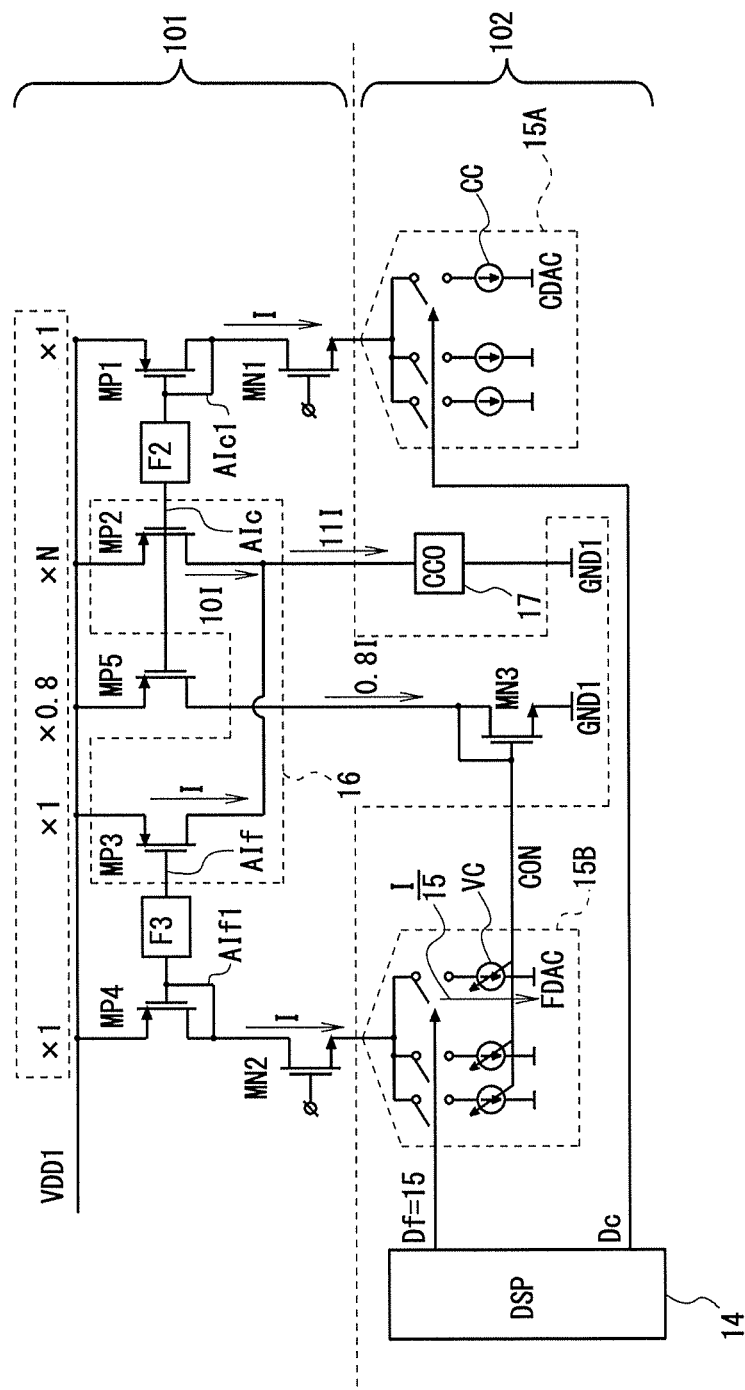
FIG. 4 is a drawing showing current in the locked PLL circuit.

FIG. 4 is a drawing showing current in the locked PLL circuit 100. In this case, ICCO=Ic2+If2=11I. In FIG. 4, the ratio A of the current Ic3 to the current Ic1 is 0.8, the ratio B of the current IC3 to the unit current of the variable current cells VC of the FDAC 15B is 12, and an average value (a desired value and may also be referred to as a first value) of the digital integral signal Df is 15. In this case, 15 variable current cells VC are used in the FDAC 15B, and the current flowing through one variable current cell VC is I/15.

In the locked state shown in FIG. 4, a case in which the unit current of the constant current cells CC of the CDAC 15A varies due to temperature variations or power supply variations and the current Ic1 flowing through the PMOS transistor MP1 varies (drifts) will be examined. Note that the characteristics of the CCO 17 shall not be changed by the temperature variations or the power supply variations in order to simplify the description.

Figure 5:
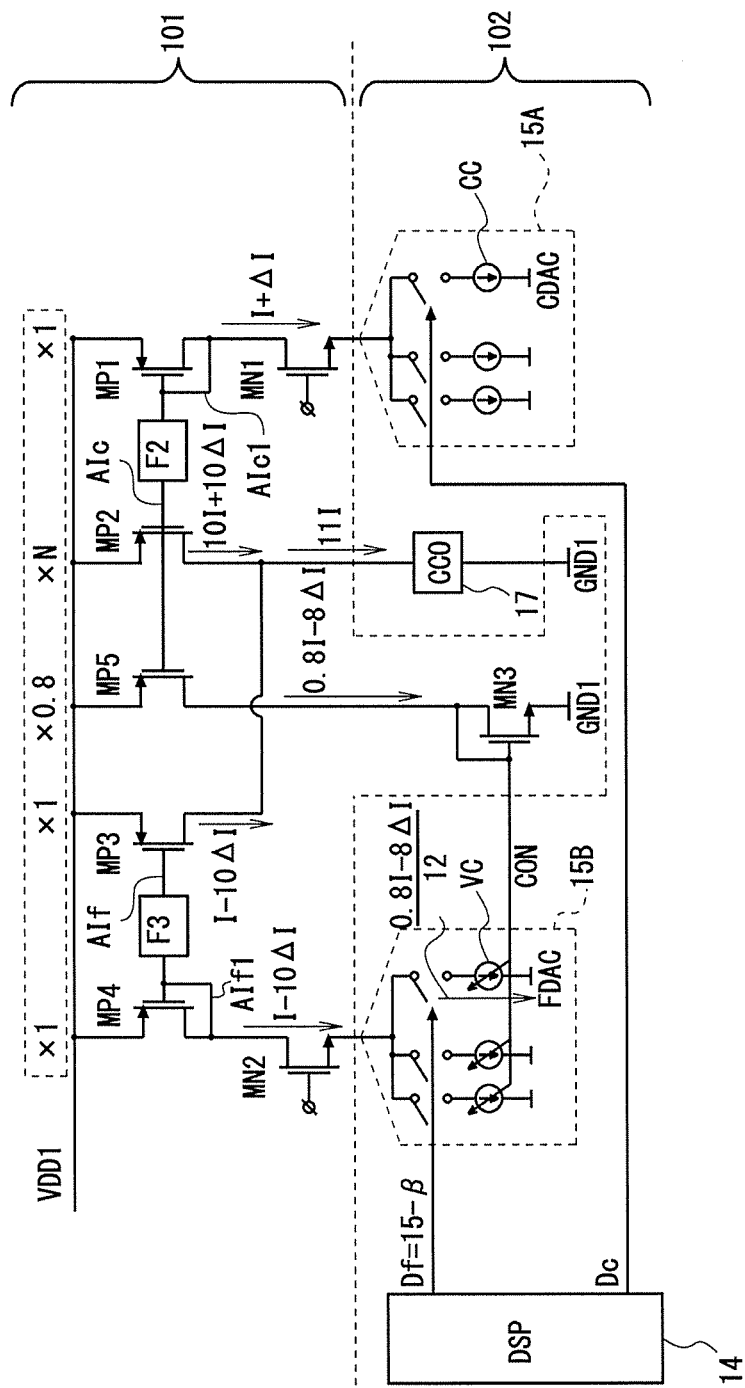
FIG. 5 is a drawing showing the PLL circuit when current drifts.

FIG. 5 is a drawing showing the PLL circuit 100 when current drifts in the PLL circuit 100. When an amount of drift that appears in the current If1 of the CDAC 15A is ΔI(ΔI>0), it will be If1=I+ΔI. As the mirror ratio of the PMOS transistor MP1 to the PMOS transistor MP2 is 1:10, it will be If2=10I+10ΔI. As the PLL circuit 100 is locked, and the control current ICCO of the CCO 17 remains at 11I, the current flowing through the PMOS transistor MP3 will be If2=I−10ΔI.

In order to maintain the control current ICCO of the CCO 17 at 11I in the PLL circuit 100, when the current If1 of the CDAC 15A increases, the DSP 14 performs feedback control in such a way that the current If1 of the FDAC 15B is reduced to cancel out the increase in the current If1. As a result, the DSP 14 reduces the value of the digital integral signal Df. Thus, the digital integral signal Df is reduced by β from a central value (15 in this example) of the digital integral signal Df when there is no current drift, i.e., the value of the digital integral signal Df will be Df-β (the value may be referred to as a second value). Note that at this time, the gate voltage of the PMOS transistor MP2 differs from that of the PMOS transistor MP3.

As the DSP 14 controls the value of the digital integral signal Df, the DSP 14 can observe β in principle. The DSP 14 controls the value of the digital integral signal Dc supplied to the CDAC 15A so that β will become zero. In this example, the DSP 14 reduces the value of the digital integral signal Dc supplied to the CDAC 15A so that β will become zero. As a result, the number of constant current cells CC used in the CDAC 15A will be reduced, the current drift ΔI will be eliminated, and the state is returned to the one shown in FIG. 4.

As a result, even when there are temperature variations or power supply variations, the ratio of the current Ic2 of the coarse adjusting path to the current If2 of the fine adjusting path can be maintained constant (Ic2:If2=10:1 in this example).

In summary, when the unit current of the constant current cells CC of the CDAC 15A varies due to temperature variations or power supply variations, the current Ic1 is increased (or reduced) by the drift. Accordingly, the DSP 14 reduces (or increases) the value of the digital integral signal Df and reduces (or increases) the current If1. Then, the DSP 14 reduces (or increases) the value of the digital integral signal Dc to eliminate the drift of the current Ic1. After that, the DSP 14 increases (or reduces) the value of the digital integral signal Df to return the value of the digital integral signal Df to an original desired value. By doing so, even when a drift is generated in the current IC1, the ratio of the current Ic2 of the coarse adjusting path to the current If2 of the fine adjusting path can be maintained constant.

As described above, according to this configuration, as the current ratio in the PLL circuit 100 can be maintained constant, variations in the characteristics caused by current variations can be prevented. It will be understood that by maintaining the current ratio constant, for example, other characteristics variations that do not depend on the current ratio can be easily observed. Thus, it is advantageous when the characteristics of the PLL circuit are analyzed.

Figure 6:
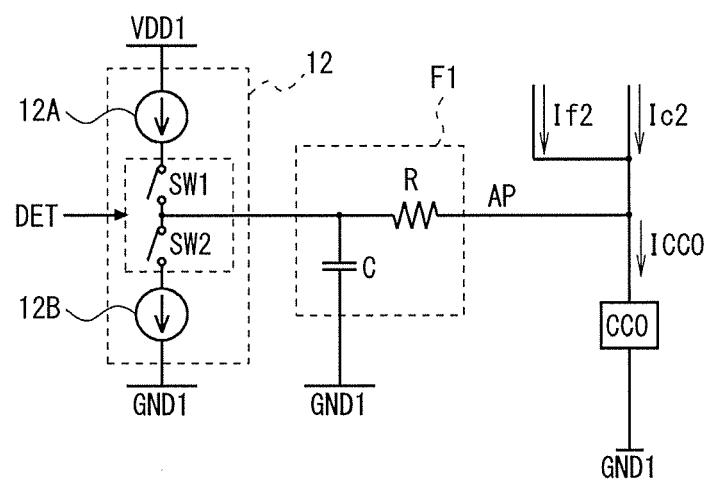
FIG. 6 is a drawing schematically showing a configuration of a charge pump, the CCO, and the filter according to the first embodiment.

Next, a configuration example of the charge pump 12, the CCO 17, and the filter F1 will be described. FIG. 6 is a drawing schematically showing the configuration of the charge pump 12 and the CCO 17 according to the first embodiment. The charge pump 12 includes, for example, constant current cells 12A and 12B and switches SW1 and SW2. The constant current cells 12A and 12B are connected in cascade between the first power supply VDD1 and a ground GND1 of the second power supply system. The switches SW1 and SW2 are connected in cascade between the constant current cells 12A and 12B. The analog proportional signal AP, which is a current signal, is output from an output node between the switches SW1 and SW2. When the switches SW1 and SW2 are turned on or off in a manner complementary to each other according to the detection signal DET, a current direction of the analog proportional signal AP, which is the current signal, is reversed.

The filter F1 is provided between the charge pump 12 and the CCO 17. The filter F1 is composed of a resistor R and a capacitor C. The capacitor C is connected between an output node that is between the switches SW1 and SW2 and the ground GND1 of the first power supply system. The resistor R is connected between the output node that is between the switches SW1 and SW2 and the CCO 17.

Although the charge pump 12, the CCO 17, and the filter F1 can be configured in the above manner, it is obvious that the above configuration is merely an example, and some or all of the charge pump 12, the CCO 17, and the filter F1 may be configured in a manner different from that of the above configuration.

Second Embodiment

Figure 7:
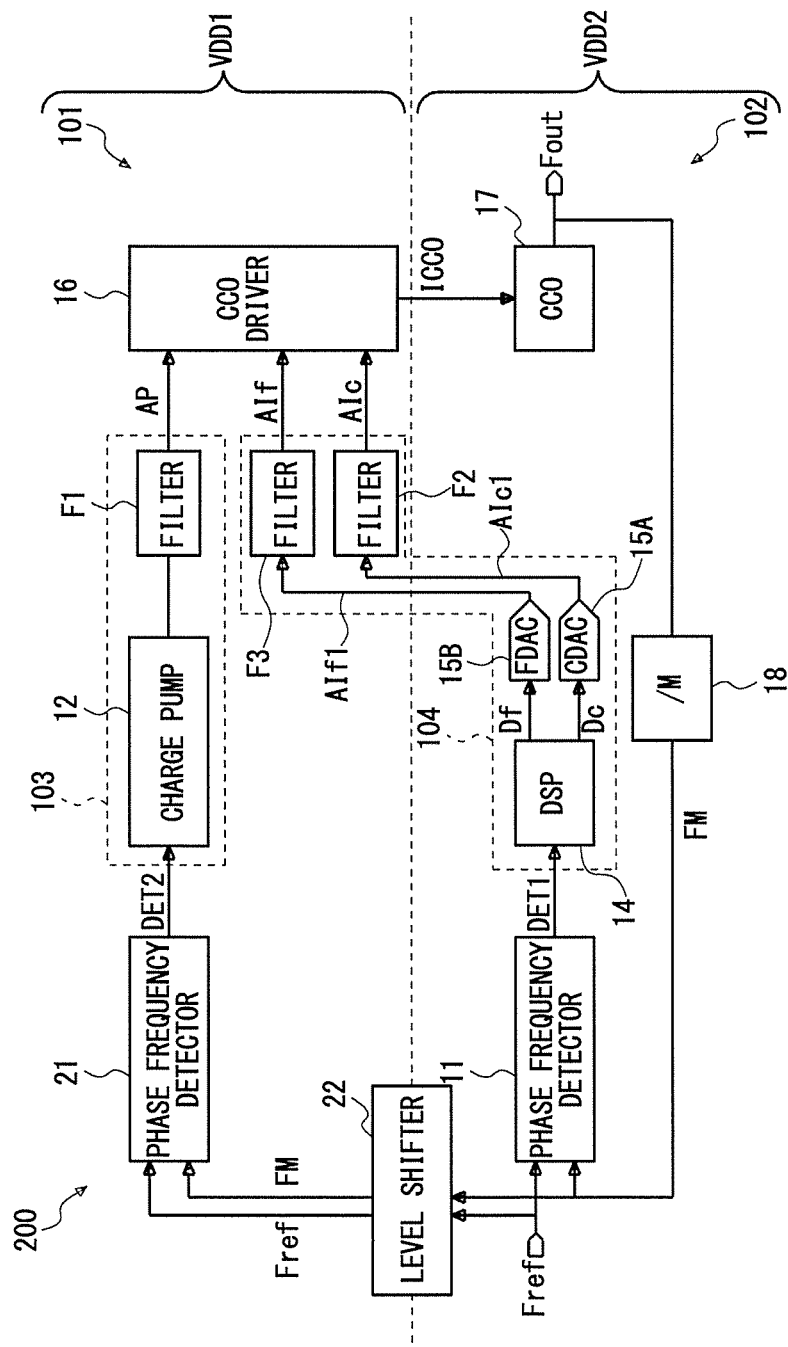
FIG. 7 is a drawing schematically showing a configuration of a PLL circuit according to a second embodiment.

A PLL circuit 200 according to a second embodiment will be described. FIG. 7 is a drawing schematically showing a configuration of the PLL circuit 200 according to the second embodiment. The PLL circuit 200 is a modified example of the PLL circuit 100 according to the first embodiment and has a configuration in which the level shifter 13 of the PLL circuit 100 is removed, and a PFD 21 and a level shifter 22 are further included therein. Hereinafter, the PFD 11 may also be referred to as a first PFD, and the PFD 21 may also be referred to as a second PFD.

The level shifter 22 is provided to exchange signals between the first power supply system 101 and the second power supply system 102. In this embodiment; the level shifter 22 shifts a voltage level of the reference signal Fref supplied in the second power supply system 102 and a voltage level of the signal FM that has been fed back through the frequency divider 18 and then supplies the reference signal Fref and the signal FM to the PFD 21 provided in the first power supply system 101.

The PFD 21 is provided in the first power supply system 101 and detects a phase difference between the reference signal Fref and the signal FM from the frequency divider 18 which have been level shifted by the level shifter 22. The PFD 21 outputs the detected phase difference (a result of the detection) as a detection signal DET2.

As the components other than the PFD 21 and the level shifter 22 of the PLL circuit 200 are the same as those of the PLL circuit 100, the descriptions will be omitted.

The PLL circuit 100 according to the first embodiment supplies the signal, which is obtained by level shifting the detection signal DET output by the PFD 11 by the level shifter 13, to the charge pump 12 of the first power supply system 101. However, when the phase difference between the reference signal Fref and the signal FM from the frequency divider 18 is small, the detection signal DET may be a pulse signal with a narrow width. When the pulse width is narrow, the level shifter may not be able to shift a level of the pulse signal having the narrow width while maintaining its waveform. That is, when the width of the pulse signal is narrow, a detection signal with a normal waveform cannot be supplied to the charge pump 12. Hence, an identity between the detection signal supplied to the charge pump 12 and the detection signal supplied to the DSP 14 cannot be retained, thereby exerting an adverse effect on the locked state of the PLL circuit.

On the other hand, in the PLL circuit 200 of this embodiment, while the PFD 11 generates a detection signal DET1 (corresponding to the detection signal DET in the PLL circuit 100) and supplies it to the integral path 104, the level shifter 22 level shifts the reference signal Fref and the signal FM from the frequency divider 18, and then the PFD 21 provided in the first power supply system 101 generates a detection signal DET2 and supplies it to the proportional path 103. As the reference signal Fref and the signal FM from the frequency divider 18 are not pulse signals that are too narrow to be successfully level shifted by the level shifter, the identity between the detection signal DET1 and the detection signal DET2 can be retained. Thus, according to this configuration, a more desired locked state of the PLL circuit can be achieved as compared to the PLL circuit 100 of the first embodiment.

Third Embodiment

Figure 8:
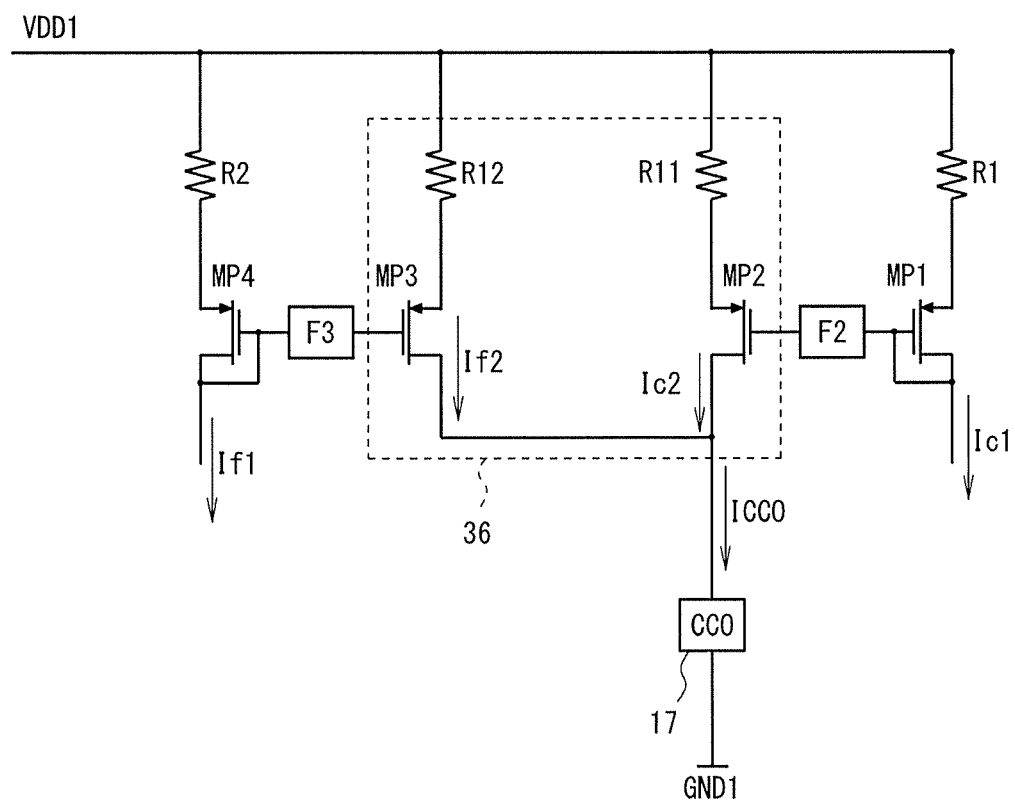
FIG. 8 is a drawing schematically showing a configuration of a CCO driver according to a third embodiment.

A PLL circuit according to a third embodiment will be described. A PLL circuit 300 has a configuration in which the CCO driver 16 of the PLL circuit 100 is replaced by a CCO driver 36. FIG. 8 is a drawing schematically showing a configuration of the CCO driver 36 according to the third embodiment. The CCO driver 36 has a configuration in which degeneration resistors R11 and R12 are further included in the CCO driver 16 of the first embodiment.

The degeneration resistor R11 (may also be referred to as a first degeneration resistor) is connected between the source of the PMOS transistor MP2 and the first power supply VDD1. The degeneration resistor R12 (may also be referred to as a second degeneration resistor) is connected between the source of the PMOS transistor MP3 and the first power supply VDD1.

Note that in this case, in order to maintain consistency in the configuration when the degeneration resistors R11 and R12 are included, a resistor R1 is connected between the source of the PMOS transistor MP1 and the first power supply VDD1 and a resistor R2 is connected between the source of the PMOS transistor MP4 and the first power supply VDD1.

According to this configuration, linearity of the CCO driver can be more improved by including the degeneration resistors as compared to the first embodiment. Moreover, by appropriately selecting resistance values of the degeneration resistors R11 and R12, a zero point of the loop characteristics of the PLL circuit can be adjusted.

Fourth Embodiment

A PLL circuit according to a fourth embodiment will be described. A PLL circuit 400 has a configuration in which a bias generation circuit that supplies a bias to the constant current cells of the CDAC 15A is included in the PLL circuit 100.

Figure 9:
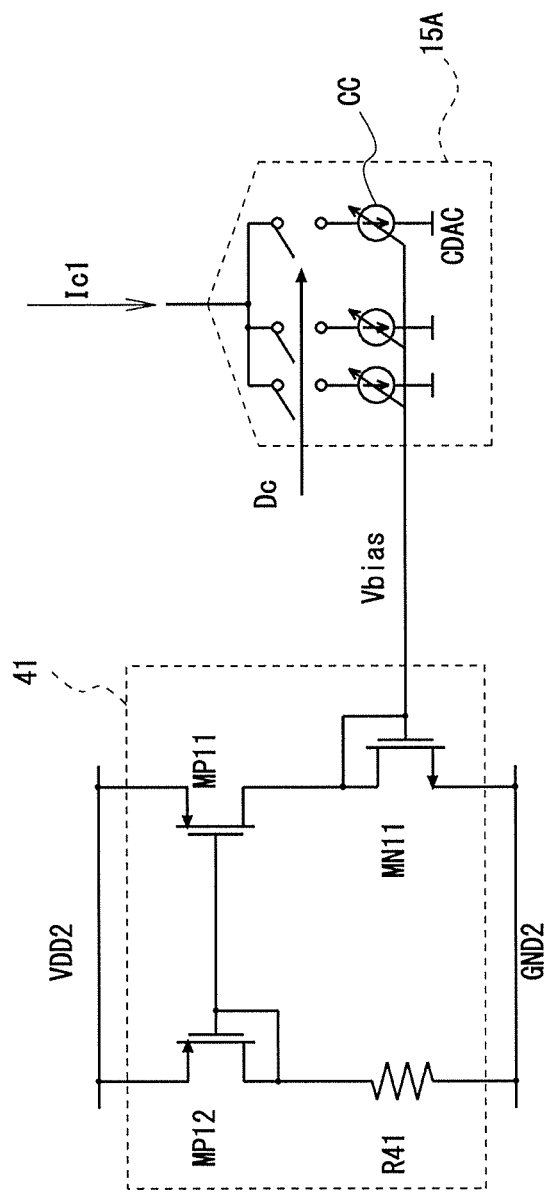
FIG. 9 is a drawing schematically showing an example of a bias generation circuit according to a fourth embodiment.

FIG. 9 is a drawing schematically showing a configuration of a bias generation circuit 41, which is an example of the bias generation circuit. The bias generation circuit 41 includes PMOS transistors MP11 and MP12, an NMOS transistor MN11, and a resistor R41.

In this configuration, the PMOS transistors MP11 and MP12 constitute a current mirror. The sources of the PMOS transistors MP11 and MP12 are connected to the second power supply VDD2 (VDD2<VDD1). Note that the sources of the PMOS transistors MP11 and MP12 may instead be connected to the first power supply VDD1. The drain of the PMOS transistor MP11 is connected to the drain of the NMOS transistor MN11. The resistor R41 is inserted between the drain of the PMOS transistor MP12 and the ground GND2 of the second power supply system. The gate of the PMOS transistor MP12 is connected to the drain of the PMOS transistor MP12 and the gate of the PMOS transistor MP11.

The source of the NMOS transistor MN11 is connected to the ground GND2 of the second power supply system. The gate of the NMOS transistor MN11 is connected to the drain of the NMOS transistor MN11 and bias terminals of the constant current cells CC of the CDAC 15A.

Then, current that is obtained by duplicating current flowing through the PMOS transistor MP12 by a predetermined mirror ratio flows through the PMOS transistor MP11. As a result, a bias voltage Vbias according to the current flowing through the PMOS transistor MP11 is input to the bias terminals of the constant current cells CC of the CDAC 15A.

As described above, according to this configuration, the bias voltage can be supplied to the constant current cells by the bias generation circuit with a simple circuit configuration.

Figure 10:
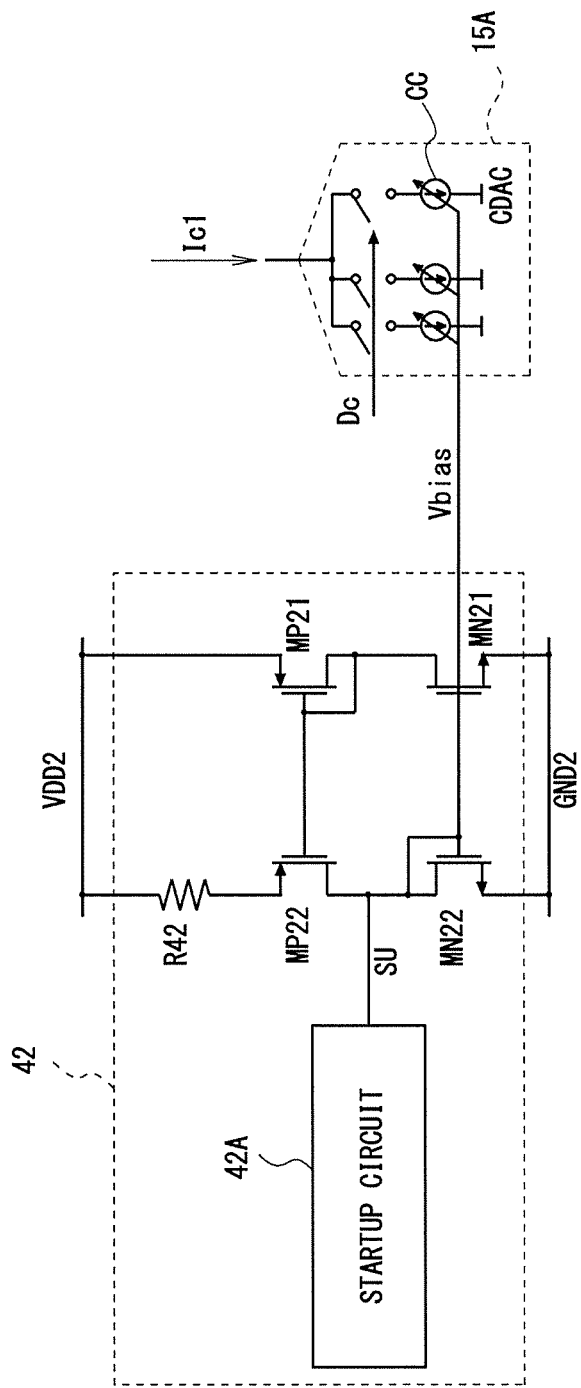
FIG. 10 is a drawing schematically showing another example of the bias generation circuit according to the fourth embodiment.

Further, the bias generation circuit may have other configurations. FIG. 10 is a drawing schematically showing a configuration of a bias generation circuit 42, which is another example of the bias generation circuit. The bias generation circuit 42 includes PMOS transistors MP21 and MP22, NMOS transistors MN21 and MN22, a resistor R42, and a startup circuit 42A.

The source of the PMOS transistor MP21 is connected to the second power supply VDD2. Note that the source of the PMOS transistor MP21 may instead be connected to the first power supply VDD1. The drain of the PMOS transistor MP21 is connected to the drain of the NMOS transistor MN21. The resistor R42 is inserted between the source of the PMOS transistor MP22 and the second power supply VDD2. The drain of the PMOS transistor MP22 is connected to the drain of the NMOS transistor MN22. The gate of the PMOS transistor MP21 is connected to the gate of the PMOS transistor MP22 and the drain of the PMOS transistor MP21.

The sources of the NMOS transistors MN21 and MN22 are connected to the ground GND2 of the second power supply system. The gate of the NMOS transistor MN22 is connected to the drain of the NMOS transistor MN22, the gate of the NMOS transistor MN21, and the bias terminals of the constant current cells CC of the CDAC 15A.

The startup circuit 42A outputs a startup signal SU to a node between the drain of the PMOS transistor MP22 and the drain of the NMOS transistor MN22.

In this configuration, in order to startup the bias generation circuit 42, firstly the startup circuit 42A outputs a HIGH level pulse signal as the startup signal SU. Then, the gates of the NMOS transistors MN21 and MN22 become a HIGH level, and the NMOS transistors MN21 and MN22 are turned on. Thus, the gates of the PMOS transistors MP21 and MP22 become a LOW level, the PMOS transistors MP21 and MP22 are turned on, and current starts to flow through the PMOS transistors MP21 and MP22.

After that, the current flowing through the PMOS transistors MP21 and the NMOS transistor MN21 and the current flowing through the PMOS transistor MP22 and the NMOS transistor MN22 will be stable as the time goes by. As a result, a gate voltage of the NMOS transistor MN21 generated by the current flowing through the NMOS transistor MN21 is input to the bias terminals of the constant current cells CC of the CDAC 15A as the bias voltage Vbias.

As described above, according to this configuration, the bias voltage can be supplied to the constant current cells by the bias generation circuit with a simple circuit configuration in a manner similar to that of the bias generation circuit 41.

Although the bias generation circuit with a simple configuration has been described above, a configuration in which the bias voltage Vbias can be controlled more precisely can be employed. To be more specific, a bandgap reference circuit may be provided in the second power supply system 102, and an output voltage of the bandgap reference circuit may be input to the bias terminals of the constant current cells as the bias voltage Vbias.

Other Embodiments

Note that the present invention is not limited by the above embodiments, and modifications can be made as appropriate without departing from the scope of the invention. For example, although the CCO driver, the filter, and the bias generation circuit are composed of the NMOS transistors and the PMOS transistors, the NMOS transistors may be replaced by the PMOS transistors and the PMOS transistors may be replaced by the NMOS transistors in order to constitute the CCO driver, the filter, and the bias generation circuit with the same functions as those in the above embodiments.

It is obvious that also in the PLL circuit 200 according to the second embodiment, the CCO driver 16 may be replaced by the CCO driver 36. Further, it is obvious that the bias generation circuit of the fourth embodiment may be included in the PLL circuit 200 according to the second embodiment.

Although in the above embodiments, it has been described that the reference signal Fref is a signal in the second power supply system 102, the reference signal Fref may instead be a signal in the first power supply system 101. In this case, in the PLL circuit 100, a PFD may be provided in the first power supply system 101, and the reference signal Fref and a signal obtained by level shifting a signal fed back from the CCO 17 by a level shifter may be supplied to the PDF. After that, the detection signal DET output by the PFD is level shifted by the level shifter and then supplied to the integral path 104. In the PLL circuit 200, the reference signal Fref may be supplied to the PFD 21 without being level shifted, and the reference signal Fref may be level shifted by the level shifter and then supplied to the PFD 11.

Although it has been described that the filters F2 and F3 are provided in the first power supply system 101, they may instead be provided in the second power supply system 102.

Although the invention made by the present inventor has been described in detail based on the embodiments, it is obvious that the present invention is not limited by the above-described embodiments, and various modifications can be made without departing from the scope of the invention.

The first to fourth embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device comprising a phase locked loop circuit, wherein the phase locked loop circuit comprises:
   a proportional path provided in a first power supply system and configured to output an analog proportional signal according to a detection signal, the detection signal indicating a phase difference between a reference signal and a signal obtained by feeding back an output signal of the phase locked loop circuit;
   an integral path provided in a second power supply system and configured to output an analog integral signal according to the detection signal, a voltage of the second power supply system being lower than that of the first power supply system;
   a current-controlled oscillator driver provided in the first power supply system and configured to output control current according to the analog proportional signal from the proportional path and the analog integral signal from the integral path;
a current-controlled oscillator provided in the second power supply system and configured to output the output signal generated by performing an oscillation operation according to the control current; and
a phase frequency detector provided in the second power supply system and configured to detect the phase difference between the reference signal and the signal obtained by feeding back the output signal and then output a result of the detection as the detection signal.

2. The semiconductor device according to claim 1, further comprising a level shifter, wherein
the phase frequency detector is provided in the second power supply system,
the reference signal is supplied through the second power supply system, and
the level shifter shifts a voltage level of the detection signal output by the phase frequency detector to a voltage level of the first power supply system and then outputs the shifted detection signal to the proportional path.

3. The semiconductor device according to claim 1, further comprising:
first and second phase frequency detectors, the first and second phase frequency detectors being the phase frequency detectors; and
a level shifter, wherein
the first phase frequency detector is provided in the second power supply system,
the second phase frequency detector is provided in the first power supply system,
the reference signal is supplied through the second power supply system,
the level shifter shifts a voltage level of the reference signal and a voltage level of the signal obtained by feeding back the output signal to a voltage level of the first power supply system and then outputs the shifted reference signal and the shifted output signal to the second phase frequency detector, and
the second phase frequency detector detects a phase difference between the reference signal level and the signal obtained by feeding back the output signal which are shifted by the level shifter and then outputs a result of the detection to the proportional path as the detection signal.

4. The semiconductor device according to claim 1, wherein
the integral path comprises:
a digital signal processing unit configured to perform digital processing on the detection signal and then output first and second digital integral signals;
a first digital to analog converter configured to convert the first digital integral signal into a first analog integral signal; and
a second digital to analog converter configured to convert the second digital integral signal into a second analog integral signal, wherein
the current-controlled oscillator driver adds third current obtained by duplicating first current, which is the first analog integral signal, by a predetermined ratio, fourth current obtained by duplicating second current, which is the second analog integral signal, by a predetermined ratio, and current of the analog proportional signal in order to generate the control current, and
the first current is greater than the second current.

5. The semiconductor device according to claim 4, wherein the current-controlled oscillator driver comprises:
a first current mirror configured to generate the third current by duplicating the first current by the predetermined ratio; and
a second current mirror configured to generate the fourth current by duplicating the second current by the predetermined ratio.

6. The semiconductor device according to claim 4, wherein the digital signal processing unit controls the current-controlled oscillator driver in such a way that a current ratio of the first current to the second current will become constant.

7. The semiconductor device according to claim 6, wherein
when there are variations in the first current and the first current is increased,
the current-controlled oscillator driver reduces the second current according to the increase in the first current,
the digital signal processing unit changes a value of the second digital integral signal from a first value, which is a value before the second current varies, to a second value in order to reduce the second current,
the digital signal processing unit reduces a value of the first digital integral signal in order to reduce the first current, and
the digital signal processing unit returns the value of the second digital integral signal from the second value to the first value in order to increase the second current, and
when there are variations in the first current and the first current is reduced,
the current-controlled oscillator driver increases the second current according to the reduction in the first current,
the digital signal processing unit changes the value of the second digital integral signal from the first value, which is the value before the second current varies, to the second value in order to increase the second current,
the digital signal processing unit increases the value of the first digital integral signal in order to increase the first current, and
the digital signal processing unit returns the value of the second digital integral signal from the second value to the first value in order to reduce the second current.

8. The semiconductor device according to claim 7, wherein
the first digital to analog converter includes a plurality of constant current cells that are connected in parallel and is configured to be capable of controlling the number of the constant current cells that output current according to the value of the first digital integral signal,
the second digital to analog converter includes a plurality of variable current cells that are connected in parallel and is configured to be capable of controlling the number of the variable current cells that output current according to the value of the second digital integral signal, and
the current output by each of the plurality of variable current cells is controlled in such a way that it is reduced when the first current is increased due to the variations, while the current output by each of the plurality of variable current cells is controlled in such a way that it is increased when the first current is reduced due to the variations.

9. The semiconductor device according to claim 8, further comprising a control signal generation unit configured to generate a control signal based on fifth current and control the current output by each of the plurality of variable current cells by the control signal, the fifth current being obtained by duplicating the third current from the first current by a predetermined ratio.

10. The semiconductor device according to claim 8, further comprising a bias voltage generation circuit configured to supply a bias voltage to the plurality of constant current cells.

11. The semiconductor device according to claim 4, further comprising:
   a first filter inserted between the first digital to analog converter and the current-controlled oscillator driver; and
   a second filter inserted between the second digital to analog converter and the current-controlled oscillator driver.

12. The semiconductor device according to claim 5, wherein the current-controlled oscillator driver comprises:
   a first degeneration resistor inserted between a power supply of the first power supply system and the first current mirror, the power supply supplying power to the first current mirror; and
   a second degeneration resistor inserted between the power supply of the first power supply system and the first current mirror, the power supply supplying power to the second current mirror.

* * * * *